United States Patent
Sarfert et al.

(10) Patent No.: US 11,747,403 B2
(45) Date of Patent: Sep. 5, 2023

(54) METHOD FOR ASCERTAINING THE STATE OF CHARGE OF AN ELECTRICAL ENERGY STORAGE UNIT

(71) Applicant: Robert Bosch GmbH, Stuttgart (DE)

(72) Inventors: Christel Sarfert, Korntal-Muenchingen (DE); Ganesh Susmitha, Stuttgart (DE); Shashank Holavanahalli, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 70 days.

(21) Appl. No.: 17/167,164

(22) Filed: Feb. 4, 2021

(65) Prior Publication Data
US 2021/0247454 A1     Aug. 12, 2021

(30) Foreign Application Priority Data
Feb. 7, 2020 (DE) .................... 10 2020 201 506.6

(51) Int. Cl.
*G01R 31/388* (2019.01)
*H02J 7/00* (2006.01)

(52) U.S. Cl.
CPC .......... *G01R 31/388* (2019.01); *H02J 7/0048* (2020.01)

(58) Field of Classification Search
CPC ............ G01R 31/388; G01R 19/16528; G01R 19/16542; G01R 31/3835; G01R 31/367; H02J 7/0048; H02J 7/007184; Y02E 60/10; H01M 10/48
See application file for complete search history.

(56) References Cited

U.S. PATENT DOCUMENTS

| | | | |
|---|---|---|---|
| 4,134,056 A * | 1/1979 | Fukui | H02J 7/04 320/161 |
| 4,460,870 A | 7/1984 | Finger | |
| 5,808,445 A | 9/1998 | Aylor et al. | |
| 9,316,693 B2 * | 4/2016 | Benjamin | G01R 31/382 |
| 10,014,685 B2 * | 7/2018 | Triebel | H02J 3/32 |
| 2004/0100267 A1 * | 5/2004 | Koch | G01R 31/3835 324/427 |
| 2009/0237033 A1 * | 9/2009 | Kanzaki | H02J 7/0029 320/134 |

(Continued)

FOREIGN PATENT DOCUMENTS

| | | |
|---|---|---|
| DE | 102014101157 A1 | 7/2015 |
| DE | 112017003472 T5 | 4/2019 |

(Continued)

*Primary Examiner* — Alexander Satanovsky
*Assistant Examiner* — Sharah Zaab
(74) *Attorney, Agent, or Firm* — Michael Best & Friedrich LLP

(57) ABSTRACT

A method for ascertaining the state of charge of an electrical energy storage unit is described. In one example, the method includes ascertaining a voltage gradient at least based on a detected first voltage value of the electrical energy storage unit; comparing the ascertained voltage gradient with a predefined voltage gradient threshold value; and ascertaining the state of charge of the electrical energy storage unit depending on the comparison. A corresponding computer program, a corresponding machine-readable storage medium, a corresponding apparatus and a corresponding electrical energy storage system are also described.

7 Claims, 4 Drawing Sheets

(56) References Cited

U.S. PATENT DOCUMENTS

| | | | | |
|---|---|---|---|---|
| 2012/0161702 A1* | 6/2012 | Kim | ................ | B60L 53/14 |
| | | | | 320/155 |
| 2013/0080096 A1* | 3/2013 | Toki | ................ | G01R 31/389 |
| | | | | 702/63 |
| 2015/0112619 A1* | 4/2015 | Takahashi | ........ | G01R 31/3835 |
| | | | | 702/63 |
| 2017/0197520 A1* | 7/2017 | Schindler | ............ | H02J 7/0048 |
| 2018/0261889 A1* | 9/2018 | Kusano | ............ | G01R 31/3648 |
| 2018/0375176 A1* | 12/2018 | Sakabe | ............ | H02J 7/00714 |

FOREIGN PATENT DOCUMENTS

| | | | | |
|---|---|---|---|---|
| JP | H1173787 | * | 3/1999 | ............ G11C 11/56 |
| JP | 2009038876 | * | 2/2009 | .......... H01M 10/482 |

* cited by examiner

METHOD FOR ASCERTAINING THE STATE OF CHARGE OF AN ELECTRICAL ENERGY STORAGE UNIT

BACKGROUND OF THE INVENTION

The present disclosure proceeds from a method for ascertaining the state of charge of an electrical energy storage unit.

Increasing electrification, in particular in the vehicle and automotive sector, has resulted in increasing use of mobile electrical energy storage systems. In order to guarantee the safety and lifetime of the electrical energy storage system, it is necessary to meet speci-fied limit values, for instance voltage and state-of-charge limit values, especially in the case of increasingly used lithium-ion technology. In addition, it is of interest in particular to users of these electrical energy storage systems to know accurately the currently still available capacity, i.e. the amount of electrical charge that can be retrieved, of the electrical energy storage units of the associated electrical energy storage system. To achieve this, said available capacity is usually ascertained continuously. Depending on the current sensors used and specific electrical energy storage units, the available amount of charge can be ascertained with varying degrees of accuracy. These capacity values can be used to show a user, for example, a remaining range left to an electrically powered vehicle or a currently retrievable electrical power based on the state of charge.

When an electrical energy storage system is not used, therefore has a quiescent phase, the chemical processes within the electrical energy storage units approximate a steady state. In the steady state, the state of charge of an electrical energy storage unit can be ascertained relatively easily and accurately by means of the associated no-load voltage characteristic curve of the electrical energy storage unit. Since this may last several minutes or hours, the steady state is not always achieved. It is therefore useful and improves the ascertainment of the state of charge if a type of evaluation is performed to determine whether the steady state has already been achieved or how greatly the non-achievement impacts on the ascertainment of the state of charge.

Document US2015112619 describes a method for determining the state of charge of a secondary battery.

Document DE112017003472 T5 describes a method for determining the state of charge of a battery.

SUMMARY OF THE INVENTION

A method for ascertaining the state of charge of an electrical energy storage unit having the features of the independent patent claim is disclosed.

In said method, a voltage gradient is ascertained based at least on a detected first voltage value of the electrical energy storage unit. This can be carried out, for example, by means of a mathematical model of the electrical energy storage unit, from which the voltage gradient, that is to say the time derivative of an electrical voltage, is ascertained by way of appropriate gradient formation. This can furthermore also be carried out based on a plurality of voltage values of the no-load voltage of the electrical energy storage unit, wherein the associated voltage values are ascertained in each case for example by subtracting a voltage value that is ascertained by means of a model from a measured voltage value. It is possible to estimate, based on the voltage gradient, how far the electrical energy storage unit still is from a steady state.

The mathematical model may comprise, for example, differential equations or difference equations or algebraic equations. Furthermore, a data-based set of characteristic curves can also be part of the mathematical model.

The ascertained voltage gradient is subsequently compared with a predefined voltage gradient threshold value. It is therefore possible to identify whether the ascertained voltage gradient lies above or below the threshold value. The comparison can also be carried out in terms of absolute value, for example. It is therefore possible to estimate whether the electrical energy storage unit is close to the steady state.

The state of charge is subsequently ascertained depending on the comparison. If the comparison revealed that the absolute value of the ascertained voltage gradient lies below the predefined voltage gradient threshold value, this indicates that the electrical energy storage unit is close to the steady state and an ascertained no-load voltage value can be used to ascertain the state of charge as a sole value or with a greater weighting.

The method is therefore advantageous since the state of the electrical energy storage unit is evaluated based on the voltage gradient and the state of charge is ascertained accordingly. An increased accuracy of the ascertained state of charge is therefore achieved. Furthermore, a state of charge based inter alia on a no-load voltage characteristic value is ascertained more quickly since it is not necessary to wait for a predefined period of time until a steady state has definitely been achieved but instead this can be decided upon using the gradient very quickly and reliably without a waiting time. A reliable state-of-charge value is therefore available more quickly.

The method can be implemented by computer, for example.

Further advantageous embodiments of the present invention are the subject mat-ter of the dependent claims.

In addition to the already mentioned value, the voltage gradient is expediently ascertained furthermore at least based on a detected second voltage value of the electrical energy storage unit and/or furthermore at least based on a mathematical model of the electrical energy storage unit. This is advantageous since different ascertainment options are therefore possible depending on the application. Advantages such as an increased accuracy of the ascertained voltage value or gradient are also achieved by taking into account polari-zation or a flowing quiescent current that are still present in the measurement but are not considered.

A period of time in which the electrical energy storage unit has drawn and/or output a current below a no-load current threshold value in terms of absolute value is expediently ascertained. In this case, the state of charge is additionally ascertained depending on the ascertained period of time. This is advantageous when a state of charge is ascertained, for example, after a longer period of disuse of the electrical energy storage unit. If the ascertained period of time exceeds a predefined first period-of-time threshold value, a state of charge can be ascertained for example immediately from a then ascertained voltage value of the electrical energy storage unit. If the period of time undershoots a predefined second pe-riod-of-time threshold value, the last ascertained state-of-charge value can continue to be used as the ascertained state of charge, for example.

A quality characteristic value of an ascertained state of charge value is expediently ascertained in order to evaluate the accuracy of the state of charge ascertainment. In this case, the state of charge is additionally ascertained depending on the ascertained quality characteristic value. This is advantageous since an ascertained, that is to say known, state of charge with a high quality, for example with high accuracy, has a greater weighting in the further ascertainment of the state of charge than a known state of charge with a lower quality.

The ascertainment of the quality characteristic value expediently comprises ascertaining an accuracy of a modeled no-load voltage characteristic curve and/or ascertaining an accuracy of a current measurement. This is advantageous since both factors have a sig-nificant influence on the quality of the ascertained state of charge. If, for example, the current measurement is inaccurate, an error in the determination of the state of charge significantly increases over time upon integration of the measured current for the purpose of determining the state of charge, which reduces the quality of the ascertained state of charge. An appropriate quality value can be set more accurately by appropriate consideration.

Also subject of the disclosure are a computer program that is configured so as to execute all steps of the method disclosed above and also a machine-readable storage medium on which the computer program is stored. The aforementioned advantages can therefore be achieved.

Also subject of the disclosure are an apparatus that comprises at least one means that is configured so as to execute the steps of the disclosed method, and also an electrical energy storage system having an electrical energy storage unit and said apparatus.

The at least one means may comprise, for example, a battery management controller and an associated power electronics system, for example an inverter, and also current sensors and/or voltage sensors and/or temperature sensors. In addition, an electronic control unit, in particular in the form of a battery management controller, can be such a means.

An electronic control unit can refer to, in particular, an electronic controller that comprises, for example, a microcontroller and/or an application-specific hardware module, e.g. an ASIC, but equally it can include a personal computer or a programmable logic controller.

In particular, an electrical energy storage unit can refer to an electrochemical battery cell and/or to a battery module containing at least one electrochemical battery cell and/or to a battery pack containing at least one battery module. For example, the electrical energy storage unit may be a lithium-based battery cell or a lithium-based battery module or a lith-ium-based battery pack. In particular, the electrical energy storage unit may be a lithium-ion battery cell or a lithium-ion battery module or a lithium-ion battery pack. Furthermore, the battery cell may be a rechargeable battery of type lithium-polymer, nickel-metal hydride, lead, lithium-air or lithium-sulfur, or quite generally may be a rechargeable battery of any electrochemical composition.

BRIEF DESCRIPTION OF THE DRAWINGS

Advantageous embodiments of the invention are illustrated in the figures and are explained in greater detail in the following description.

In the drawings.

DETAILED DESCRIPTION

Identical reference signs designate identical apparatus components or identical method steps in all the figures.

Figure 1:
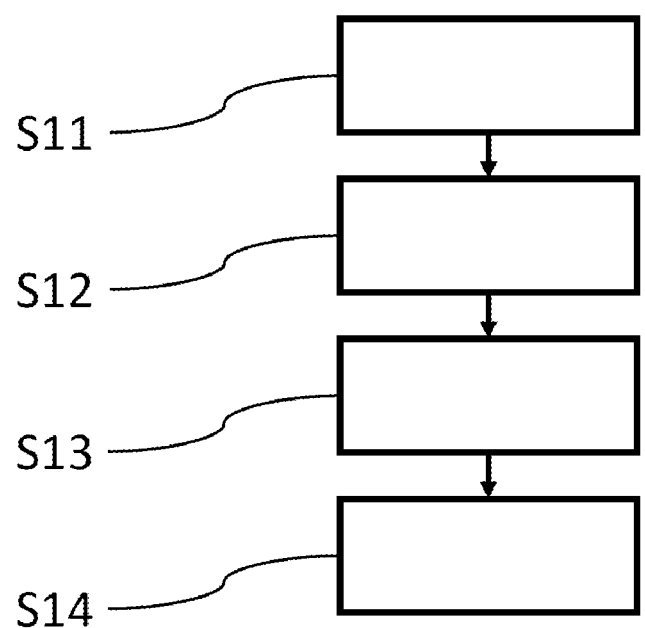
FIG. 1 shows a flowchart of the disclosed method according to a first embodiment.

FIG. 1 shows a flowchart of the disclosed method for ascertaining the state of charge of an electrical energy storage unit according to a first embodiment. In said method, in a first step S11, a voltage gradient is ascertained at least based on a detected first voltage value of the electrical energy storage unit. The voltage gradient can be ascertained, for example, from two voltage values, which are ascertained at different points in time. The two voltage values can each be ascertained, for example, by subtracting a measured voltage value from a voltage value that has been ascertained by a mathematical model. The voltage gradient is obtained by subtracting the two voltage values obtained in this way and subsequently dividing by the time interval.

In a second step S12, the ascertained voltage gradient is compared with a predefined voltage gradient threshold value in order to ascertain whether the voltage gradient threshold value is exceeded or undershot.

In a third step S13, the state of charge of the electrical energy storage unit is subsequently ascertained depending on the comparison. If, for example, the absolute value of the ascertained voltage gradient lies below the predefined voltage gradient threshold value, this shows that the electrical energy storage unit is relatively near to the steady state. The state of charge of the electrical energy storage unit can therefore be ascertained from the no-load voltage characteristic curve with a good degree of accuracy and a previously ascertained state-of-charge value can be left out of consideration.

Figure 2:
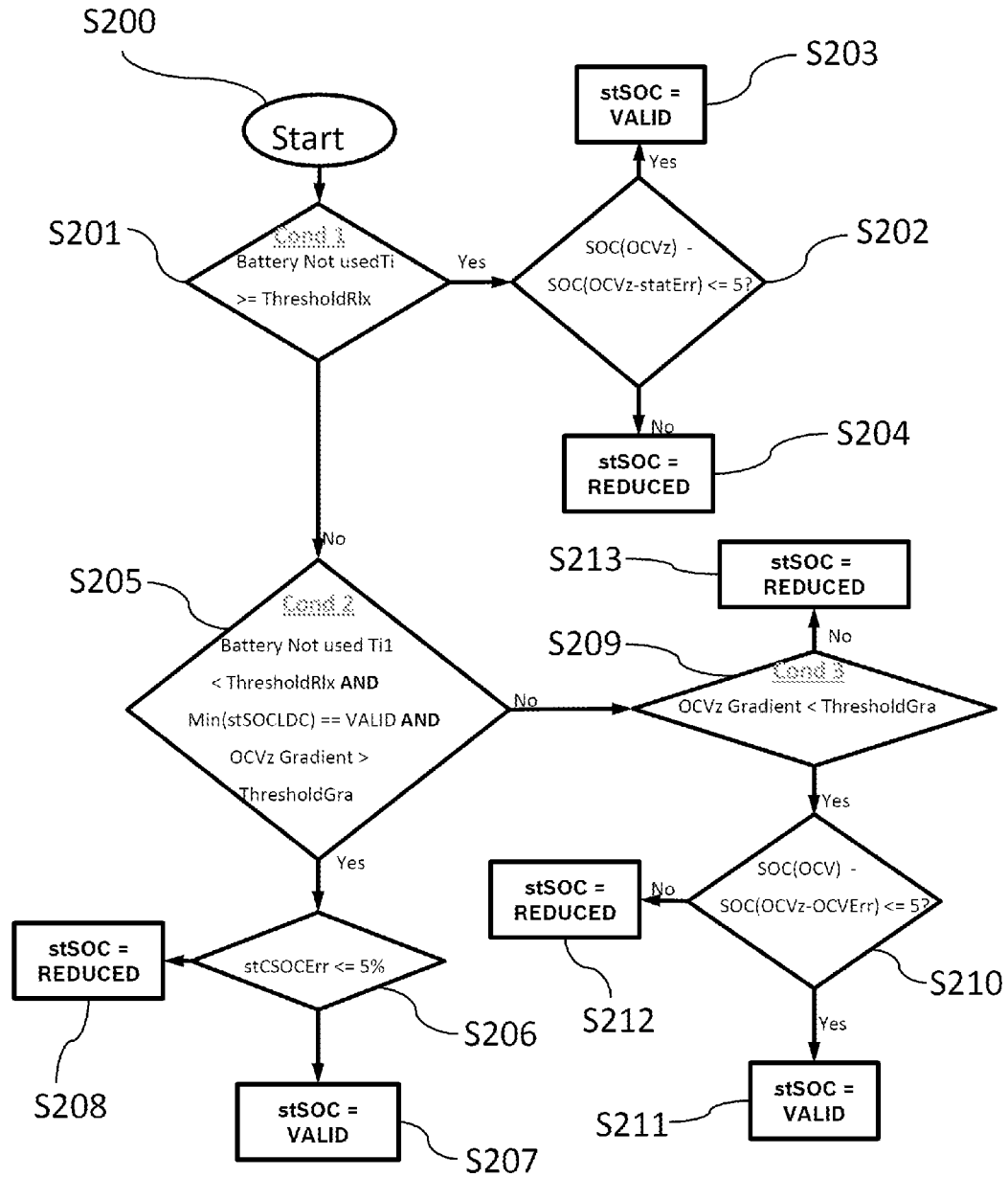
FIG. 2 shows a flowchart of the disclosed method according to a second embodiment.

FIG. 2 shows a flowchart of the disclosed method for ascertaining the state of charge of an electrical energy storage unit according to a second embodiment. The method is initiated in a first step S200.

In a second step S201, a check is carried out to determine whether the electrical energy storage unit has not been used in a predefined first period, that is to say whether at a maximum a low current in comparison to the capacity of the electrical energy storage unit has flown.

If yes, in a third step S202, a check is carried out to determine whether an error in the state-of-charge ascertainment, that is to say a state-of-charge ascertainment error, is smaller than a predefined state-of-charge ascertainment error based on a no-load voltage value.

If yes, in a fourth step S203, a high quality characteristic value is assigned to the state-of-charge value ascertained in this way, which means that both the state-of-charge value quality and the state-of-charge value accuracy of the state-of-charge value are high.

If no, in a fifth step S204, an average quality characteristic value is assigned to the state of charge value ascertained in this way, which means that even though the state of charge value quality is high, the state of charge value accuracy is low.

If the condition of the electrical energy storage unit not having been used in a predefined period is not satisfied, further conditions are checked in a sixth step S205. A check is carried out to determine whether the battery has not been used in a predefined second period. In this case, the predefined second period is preferably shorter than the predefined first period. Another check is carried out to determine whether a state-of-charge value ascertained at a previous point in time has a high quality characteristic value. Another check is carried out to determine whether an ascertained voltage gradient is greater than a predefined voltage gradient threshold value.

If the previously mentioned conditions are satisfied, in a seventh step S206, another check is carried out to determine whether a state-of-charge ascertainment error is smaller than a predefined state-of-charge ascertainment error. If yes, in an eighth step S207, a high quality characteristic value is assigned to the ascertained state of charge value, which means that both the state of charge value quality and the state of charge value accuracy of the state of charge value are high.

If no, in a ninth step S208, an average quality characteristic value is assigned to the ascertained state-of-charge value.

If the three previously mentioned conditions are not satisfied, in a tenth step S209, a check is carried out to determine whether the ascertained voltage gradient is smaller than the predefined voltage gradient threshold value. If yes, in an eleventh step S210, a check is carried out to determine whether an error in the state-of-charge ascertainment, that is to say a state-of-charge ascertainment error, is smaller than a predefined state-of-charge ascertainment error based on a no-load voltage value.

If yes, in a twelfth step S211, a high quality characteristic value is assigned to the ascertained state-of-charge value. If no, in a thirteenth step S212, an average quality characteristic value is assigned to the ascertained state-of-charge value.

If the check in the tenth step S209 reveals that the ascertained voltage gradient is greater than the predefined voltage gradient threshold value, in a fourteenth step S213 a low quality characteristic value is assigned to the ascertained state-of-charge value.

In particular when the method is carried out repeatedly, the quality and accuracy of the state of charge ascertainment can be improved by way of the thus ascertained state-of-charge value and the corresponding quality characteristic value.

Figure 3:
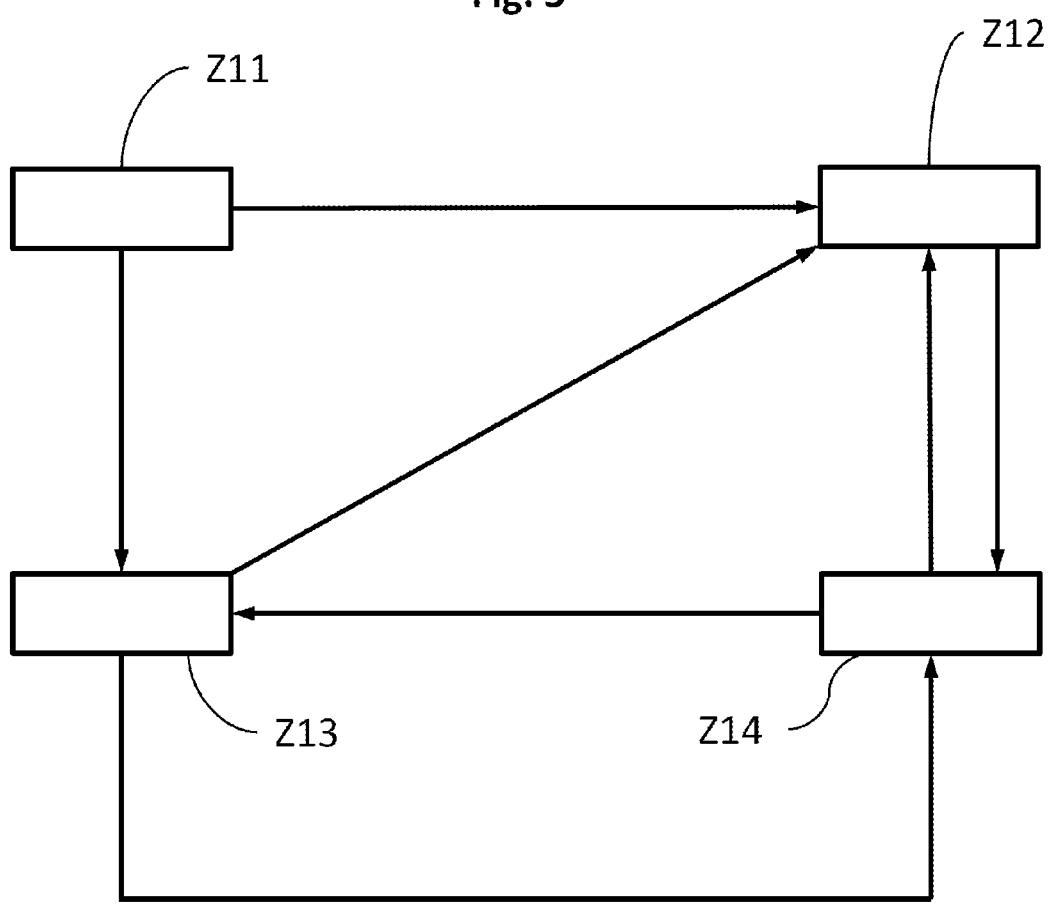
FIG. 3 shows a schematic illustration for the ascertainment of the quality characteristic value according to one embodiment.

FIG. 3 shows a schematic illustration for the ascertainment of the quality characteristic value according to one embodiment. In a first state Z11, the quality characteristic value has an initial value.

If the correct initiation with the current state-of-charge value, which is able to be ascertained, for example, by means of a no-load voltage value, is unsuccessful or is judged to be too unreliable and furthermore a current measurement provides invalid values, there is a change to a state Z12 and a low quality characteristic value is assigned to an ascertained state-of-charge value.

If this is not the case, a reliable state-of-charge value and a reliable current measurement are therefore present and furthermore the quality of the no-load voltage characteristic curve and a current measurement error is low, a high quality characteristic value is assigned to an ascertained state-of-charge value; this is the case in state Z13.

If proceeding from the state Z13 a high current measurement error is identified (this can depend on the current level) or a poor quality of the no-load voltage characteristic curve is identified (this can depend on the state of charge), there is a change to the state Z14, in which an average quality characteristic value is assigned to an ascertained state-of-charge value. If in the state Z14 a high quality of the no-load voltage characteristic curve and a low current measurement error are identified, there is a change to the state Z13.

If the current measurement provides invalid values, there is always a change to the state Z12 and a low quality characteristic value is assigned to an ascertained state-of-charge value.

Figure 4:
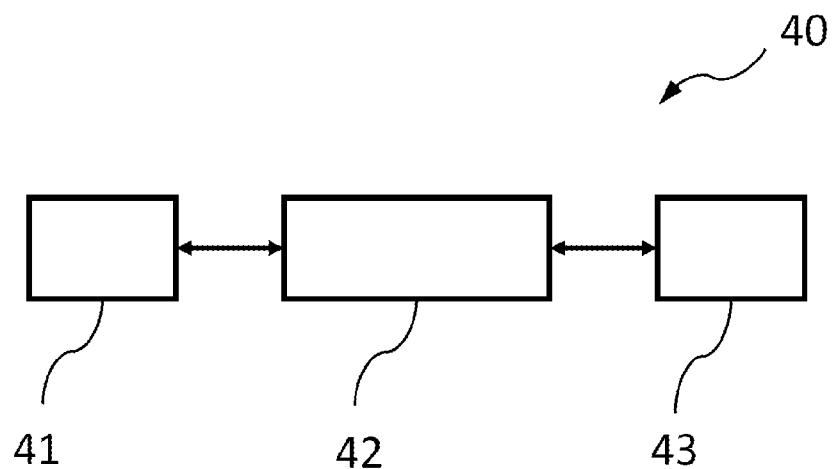
FIG. 4 shows a schematic illustration of the disclosed electrical energy storage system including the disclosed apparatus for ascertaining the state of charge according to one embodiment.

FIG. 4 shows a schematic illustration of an electrical energy storage system 40 including the disclosed apparatus 42 for ascertaining a state of charge. The electrical energy storage system 40 also has an electrical energy storage unit 41, the state of charge of which can be ascertained. The apparatus 42 can also use the ascertained state of charge in order to send appropriate control commands to an associated power electronics system 43, for example an inverter.

The invention claimed is:

1. A method for ascertaining the state of charge of an electrical energy storage unit (41), the method comprising the steps of:
   a) ascertaining a voltage gradient at least based on a detected first voltage value of the electrical energy storage unit;
   b) comparing the ascertained voltage gradient with a predefined voltage gradient threshold value;
   c) ascertaining a period of time in which the electrical energy storage unit (41) is in disuse based on an absolute value of a drawn and/or output a current falling below a no-load current threshold value in terms of absolute value; and
   d) ascertaining the state of charge of the electrical energy storage unit (41) based on the comparison and the period of time.

2. The method according to claim 1, wherein in step a) the voltage gradient is additionally ascertained (i) at least based on a detected second voltage value of the electrical energy storage unit (41), is additionally ascertained (ii) based on a mathematical model of the electrical energy storage unit (41), or is additionally ascertained by both (i) and (ii).

3. The method according to claim 1, furthermore comprising:
   e) ascertaining a quality characteristic value of an ascertained state-of-charge value in order to evaluate the accuracy of the state-of-charge ascertainment, wherein in step c) the state of charge is additionally ascertained depending on the ascertained quality characteristic value.

4. The method according to claim 3, wherein the ascertainment of the quality characteristic value comprises ascertaining an accuracy of a modeled no-load voltage characteristic curve and/or ascertaining an accuracy of a current measurement.

5. A non-transitory computer-readable storage medium containing instructions that when executed by a computer cause the computer to
   a) ascertain a voltage gradient at least based on a detected first voltage value of an electrical energy storage unit;
   b) compare the ascertained voltage gradient with a predefined voltage gradient threshold value;
   c) ascertain a period of time in which the electrical energy storage unit (41) is in disuse based on an absolute value of a drawn and/or output a current falling below a no-load current threshold value in terms of absolute value; and
   d) ascertain the state of charge of the electrical energy storage unit (41) based on the comparison and the period of time.

6. An apparatus (42) for ascertaining the state of charge of an electrical energy storage unit, the apparatus (42) comprising an electronic control unit configured to
   a) ascertain a voltage gradient at least based on a detected first voltage value of an electrical energy storage unit;
   b) compare the ascertained voltage gradient with a predefined voltage gradient threshold value;
   c) ascertain a period of time in which the electrical energy storage unit (41) is in disuse based on an absolute value of a drawn and/or output a current falling below a no-load current threshold value in terms of absolute value; and
   d) ascertain the state of charge of the electrical energy storage unit (41) based on the comparison and the period of time.

7. An electrical energy storage system (40), comprising an electrical energy storage unit (41) and an apparatus (42) comprising an electronic control unit configured to
   a) ascertain a voltage gradient at least based on a detected first voltage value of an electrical energy storage unit;
   b) compare the ascertained voltage gradient with a predefined voltage gradient threshold value;
   c) ascertain a period of time in which the electrical energy storage unit (41) is in disuse based on an absolute value of a drawn and/or output a current falling below a no-load current threshold value in terms of absolute value; and
   d) ascertain the state of charge of the electrical energy storage unit (41) based on the comparison and the period of time.

* * * * *